US006785185B2

(12) United States Patent
Sumitani et al.

(10) Patent No.: US 6,785,185 B2
(45) Date of Patent: Aug. 31, 2004

(54) SEMICONDUCTOR MEMORY DEVICE, INFORMATION APPARATUS, AND METHOD FOR DETERMINING ACCESS PERIOD FOR SEMICONDUCTOR MEMORY DEVICE

(75) Inventors: Ken Sumitani, Tenri (JP); Haruyasu Fukui, Yoshino-gun (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 42 days.

(21) Appl. No.: 10/183,742

(22) Filed: Jun. 25, 2002

(65) Prior Publication Data

US 2003/0002377 A1 Jan. 2, 2003

(30) Foreign Application Priority Data

Jun. 28, 2001 (JP) ........................................ 2001-197537

(51) Int. Cl.[7] .............................. G11C 8/00; G11C 7/00
(52) U.S. Cl. ............................. 365/230.03; 365/189.02
(58) Field of Search ........................ 365/230.03, 230.05, 365/230.02, 189.02, 189.04, 239.05

(56) References Cited

U.S. PATENT DOCUMENTS

| 4,317,183 | A | * | 2/1982 | Shimizu et al. ............. 708/130 |
| 5,909,588 | A | * | 6/1999 | Fujimura et al. ............. 712/23 |
| 5,943,287 | A | * | 8/1999 | Walton ................... 365/230.03 |
| 6,000,606 | A | * | 12/1999 | Dethloff ..................... 235/375 |
| 6,047,888 | A | * | 4/2000 | Dethloff ..................... 235/380 |
| 6,108,742 | A | * | 8/2000 | Jeong .......................... 710/53 |
| 6,502,149 | B2 | * | 12/2002 | MacLellan et al. ......... 710/113 |
| 2001/0053090 | A1 | | 12/2001 | Takata et al. |

FOREIGN PATENT DOCUMENTS

| EP | 0 357 361 A2 | 3/1990 |
| EP | 0 458 614 A2 | 11/1991 |
| EP | 1 164 594 A1 | 12/2001 |
| JP | 2000-298614 | 10/2000 |
| JP | 2001-357684 | 12/2001 |
| WO | WO 98/29816 | 7/1998 |

OTHER PUBLICATIONS

Derwent® English Abstract of JP 2001–357684 published on Dec. 26, 2001.

* cited by examiner

Primary Examiner—Thong Q. Le
(74) Attorney, Agent, or Firm—Morrison & Foerster LLP

(57) ABSTRACT

A semiconductor memory device comprises first and second memory sections including a plurality of memory elements, and a memory control section for allowing a data transfer operation between the first and second memory sections based on an external control command while allowing a memory operation to at least one of the first and second memory sections. At least one of the first and second memory sections include a plurality of small memory regions, and the memory control section allows each of the plurality of small memory regions to be separately and simultaneously subjected to an access operation.

21 Claims, 10 Drawing Sheets

(a)

(b)

(c)

SEMICONDUCTOR MEMORY DEVICE, INFORMATION APPARATUS, AND METHOD FOR DETERMINING ACCESS PERIOD FOR SEMICONDUCTOR MEMORY DEVICE

BACKGROUND OF THE INVENTION

1. Field of the Invention

The present invention relates to a semiconductor memory device in which high-speed data transfer is carried out. The present invention also relates to an information apparatus using the semiconductor memory device and a method for determining an access period for the semiconductor memory device.

2. Description of the Related Art

A semiconductor memory device, such as an EEPROM (flash memory), requires a much longer time for the writing of data than that for an SRAM (Static Random Access Memory) and a DRAM (Dynamic Random Access Memory). Conventionally, in order to accelerate the write speed of such a semiconductor memory device, data is first accumulated in a buffer region comprising of another type of memory element, such as an SRAM and the like, which are incorporated into the semiconductor memory device, and the accumulated data is then transferred together to the semiconductor memory device (an EEPROM, etc.).

This method has the following drawbacks. For example, the buffer region is used only for a buffering function and there is a large limitation when the buffer region is used for other purposes. Typically, since data to be written into the buffer region is deployed in another memory in advance, the efficiency of memory use is low.

To solve these drawbacks, the present inventors previously disclosed a semiconductor memory device in Japanese Patent Application No. 2000-176182, in which a high-speed writable memory is incorporated without a buffer and further in which a data transfer section is provided between the high-speed writable memory and a non-volatile semiconductor memory element, such as an EEPROM and the like, thereby making it possible to further improve write speed and the efficiency of memory use.

With such a device, data can be transferred from a RAM for use in normal tasks to an EEPROM or the like, thereby making it unnecessary for write data to be deployed into a different region in advance, or for an EEPROM or the like to be separately controlled so as to write data to a buffer. Use of an incorporated high-speed writable memory in tasks of a system or the like essentially requires a simultaneous execution of an external memory operation and a data transfer operation. To this end, as the high-speed writable memory, a dual port memory was preferably used.

However, the dual port memory has drawbacks, such as a large increase in cell area, a degradation in characteristics of memory elements, and the like. Further, an increase in memory capacity disadvantageously leads to an increase in cost, an increase in an area occupied by elements, a decrease in performance, and the like.

The term "external memory operation" as used herein indicates that a memory is operated by a command issued from outside of the memory so that data is input to the memory issued from out side of the memory or is output outside of the memory.

The term "externally" in "externally read", "externally written", "externally instructed", and the like, as used herein indicates that such an operation is controlled by a command issued from outside so that data or instructions are transferred from or to outside of the memory.

FIG. 10 is a block diagram of an exemplary configuration of a conventional semiconductor memory device, showing major parts thereof. The semiconductor memory device carries out memory operations for a first conventional memory comprising of high write-speed memory elements and a second conventional memory comprising of low write-speed memory elements, and a data transfer operation which transfers data (the contents of the memory) between the memories. The semiconductor memory device will be described with reference to FIG. 10. In the data transfer operation, data is mainly transferred from the high write-speed memory to the low write-speed memory. Reverse data transfer is also useful since the load of an external control device or the like can be reduced. There is substantially no difference in the data transfer operation between both directions. Here, only data transfer from the high write-speed memory to the low write-speed memory will be described.

As shown in FIG. 10, a semiconductor memory device 490 comprises: a control bus 401 and a data bus 402 externally connected: a switching circuit 410 (MUX0) for transferring information to each section in accordance with external control instructions; a write state machine (WSM) 460 for controlling data transfer operations and the like; a memory 430 (MEM1), such as an SRAM and the like, comprising of high-speed writable memory elements; a switching circuit 420 (MUX1) for switching between control of the memory 430 instructed by the WSM 460 and control of the memory 430 externally instructed; a memory 450 (MEM2), such as a flash memory and the like, comprising of rewritable memory elements; and a switching circuit 440 (MUX2) for switching between control of the memory 450 instructed by the WSM 460 and control of the memory 450 externally instructed.

Control information is externally input to the semiconductor memory device 490 through the control bus 401 and the data bus 402 including address buses. When the control information is intended for the memory 430, the switching circuit 410 is used to transfer the control information via a control bus 411 and a data input/output bus 412 to the switching circuit 420. When the control information is intended for the memory 450, the control information is transferred via a control bus 413 and a data input/output bus 414 to the switching circuit 440. Further, when the control information relates to a data transfer operation, the control information is transferred via a control bus 415 and a data input/output bus 416 to the WSM 460.

It should be noted that a write operation to the memory 450 requires the WSM 460 when complicated control is necessary like writing to the EEPROM. In this case, the switching circuit 410 gives a rewrite instruction to the WSM 460 via the control bus 415 and the data bus 416 like a data transfer operation.

Next, a specific operation of the semiconductor memory device 490 will be described.

When data is externally read from the memory 430, the switching circuit 410 is instructed via the control bus 401 to read data from the memory 430. When control information received via the control bus 401 indicates a read operation from the memory 430, the switching circuit 410 gives a read instruction to the switching circuit 420 via the control bus 411, and the switching circuit 420 gives a read instruction to the memory 430 via a control bus 421.

When the memory 430 is instructed via the control bus 421 to perform a read operation, the memory 430 reads data stored in designated memory elements, and outputs the data via a data bus 422 to the switching circuit 420. The switching circuit 420 receives the data from the data bus 422, and transfers the data via the data bus 412 to the switching circuit 410.

The switching circuit 410 outputs the data received from the data bus 412 to outside of the memory device 490 via the data bus 402. A series of the above-described operations allows external read out from the memory 430.

Next, the case when data is externally written to the memory 430 will be described. A write instruction is transferred via the control bus 401 to the switching circuit 410 to the memory 430. Data to be written is input via the data bus 402 to the switching circuit 410.

When control information received via the control bus 401 is a write operation to the memory 430, the switching circuit 410 gives a write instruction via the control bus 411 to the switching circuit 420, and data to be written is input via the data bus 412 to the switching circuit 420.

The switching circuit 420 gives a write instruction via the control bus 421 to the memory 430, and inputs data to be written to the memory 430 via the data bus 422.

When the memory 430 is instructed via the control bus 421 to perform a write operation, data input via the data bus 422 is written to designated memory elements. A series of the above-described operations can achieve an external write operation to the memory 430.

It should be noted that an operation in which data is externally read from the memory 450 is similar to that in which data is externally read from the memory 430, and therefore a description thereof is herein omitted.

Next, the case when data is externally written to the memory 450 will be described. If memory elements constituting the memory 450 allow a simple write operation, such a write operation can be achieved by a control operation similar to the write operation to the memory 430. However, for example, if a memory which requires complicated control, such as an EEPROM, is used, the WSM 460 is required for controlling write operations.

In this case, a write control instruction is externally given via the control bus 401 to the memory 450. When data to be written is specified by the data bus 402, the switching circuit 410 instructs the WSM 460 to perform a write control operation via the control bus 415 and the data bus 416.

The write control instruction is transferred via a control bus 463 to the switching circuit 440, and data to be written is input to the memory 450 from the switching circuit 410 directly via a data bus 414, or data to be written is input via the data bus 416, then WSM 460, and then a data bus 464.

The switching circuit 440 uses a control bus 441 to control a write operation to the memory 450 so that data to be written is input via a data bus 442 to the memory 450.

When the WSM 460 is used, even if the memory 450 is a memory requiring complicated control operations, such as an EEPROM, a series of the above-described operations allow a write operation to the memory 450.

Next, a data transfer operation from the memory 430 to the memory 450 will be described. A data transfer operation is required mainly when data is transferred from a high write-speed memory to a low write-speed memory. This case will be described. It should be noted that a data transfer function from a low write-speed memory to a high write-speed memory is useful so as to reduce the load of an external control device, and can be implemented by a conventional technique. A control method therefor is similar to that when data is transfer from a high write-speed memory to a low write-speed memory, and therefore a description thereof is herein omitted.

When a data transfer operation instruction (control instruction by a control command) is externally given to the switching circuit 410 via the control bus 401 and the data bus 402, the switching circuit 410 transfers information required for data transfer, such as the receipt of the data transfer operation instruction, a region to which data is to be transferred, and the like, to the WSM 460 via the control bus 415 and the data bus 416.

When the WSM 460 is instructed via the control bus 415 and the data bus 416 to perform a data transfer operation from the memory 430 to the memory 450, the WSM 460 instructs the switching circuit 420 via a control bus 461 to read data to be transferred to the memory 430.

The switching circuit 420 reads data from the memory 430 designated by the control bus 461, via the control bus 421 and the data bus 422, and transfer the read data via a data bus 462 to the WSM 460.

The WSM 460, which received the data to be transferred from the switching circuit 420, uses the control bus 463 to instruct the switching circuit 440 to write the data to the memory 450.

The data to be written is transferred via the data bus 464 to the switching circuit 440. The switching circuit 440 uses the control bus 441 and the data bus 442 to carry out a write operation to the memory 450, which is the instruction given via the control bus 463 and the data bus 464.

When a plurality of pieces of data are transferred, the WSM 460 carries out the above-described data transfer operation for all of the designated data, thereby completing the data transfer operation.

Here, if a read operation from the memory 430 designated by the WSM 460 conflicts with an external control command issued to the memory 430, the switching circuit 420 judges the confliction of the control command information, and informs the WSM 460 of the confliction of the control command information using a judgment signal 425.

If the semiconductor memory device 490 is designed to permit access to the memory 430 during a data transfer operation, it is possible that external control information to the memory 430 conflicts with control information from the WSM 460. If such a confliction occurs, the operation of the switching circuit 420 varies depending on the specification of the semiconductor memory device 490. When an external memory operation is designed to have priority over a data transfer operation, the switching circuit 420 uses the control bus 421 and the data bus 422 to control the memory 430 to transfer read data, if in a read operation for example, via the data bus 412 to the switching circuit 410.

Conversely, if it is assumed that a data transfer operation has priority over an external control command, when a confliction occurs as to control information, the switching circuit 420 uses the control bus 421 and the data bus 422 to carry out a data transfer operation (an access operation to the designated memory 430) and informs the WSM 460 of the cancellation of an external memory operation using the judgment signal 425. In this situation, since it is possible that external access is not normally carried out, a means for externally checking whether or not a control is normally completed is required. In this case, the check operation instruction is externally given via the control bus 415 and the data bus 416 to the WSM 460. The WSM 460 uses the control bus 415 and the data bus 416 to transfer a content indicating the result of the judgment signal 425 to the switching circuit 410, and the content is output outside of the memory device 490 from the switching circuit 410 via the data bus 402.

Alternatively, another means for externally checking the completion of a memory operation may be achieved as follows. The judgment signal 425 is not transferred to the WSM 460, but instead the judgment signal 425 is transferred to the switching circuit 410, and only the switching circuit 410 is used to externally check the completion of a memory operation.

A control command to the memory 450 can be designed so that an external memory operation and a data transfer operation from the WSM 460 are separately carried out. Since such an operation is similar to that of the control of the memory 430, a description thereof is omitted.

As described above, in conventional techniques, a data transfer operation and an external memory operation can be separately carried out. However, when a data transfer operation has priority over an external memory operation, the external memory operation becomes more complicated than a typical memory. When an external memory operation has priority over a data transfer operation, the data transfer operation is affected, and a time required for the data transfer operation is elongated. Particularly, when an external memory operation is complicated, or when an external memory operation takes a long time, the probability that the external memory operation conflicts with the data transfer operation is dramatically increased. In these situations, the data transfer operation is affected to a large degree.

In a conventional semiconductor memory device having a function of transferring data between a high write-speed memory and a low write-speed memory, the high write-speed memory can be used for a working memory for a system, and the like. Further, if during a data transfer operation, next data to be transferred to the low write-speed memory is temporarily stored in another region in the high write-speed memory, the performance of the data transfer can be expected to be improved.

In an SRAM and a DRAM which are representative high write-speed memories, reading and writing are carried out at high speed in substantially the same cycles. The reading and writing can be controlled irrespective of the status of the device except for special situations. Further, in this case, verification of the reading or writing is not carried out. If there is a possibility that reading or writing fails due to a constraint on the state of the device, it is necessary that the success or failure of the control is output outside, and an external control device receives and displays the success-or-failure signal, for example.

To avoid such a complicated operation, the high write-speed memory often has priority over the external memory operation irrespective of whether or not a data transfer operation is being carried out.

However, interruption of a data transfer operation during an external memory operation may cause a reduction in data transfer rate. Particularly, when an external memory operation is frequent or a single control operation (memory operation) takes a long time, a reduction in data transfer rate is significant.

To avoid this, a dual port memory can be used as a memory at a data transferring end. Unfortunately, the dual port memory inevitably leads to an increase in cell area, and the like, and further leads directly to an increase in cost or an area occupied by elements, and the like.

The object of the present invention is to solve the above-described problems.

SUMMARY OF THE INVENTION

According to one aspect of the present invention, a semiconductor memory device comprises first and second memory sections including a plurality of memory elements, and a memory control section for allowing a data transfer operation between the first and second memory sections based on an external control command while allowing a memory operation to at least one of the first and second memory sections. At least one of the first and second memory sections include a plurality of small memory regions. The memory control section allows each of the plurality of small memory regions to be separately and simultaneously subjected to an access operation. Thereby, the above-described object is achieved. Access operations as used herein include memory operations, such as read operations, write operations, erase operations, verify operations, and the like, and further read and write operations to a memory in data transfer.

In one embodiment of this invention, the memory control section controls the plurality of small memory regions so that one small memory region is used for a data transfer operation while another small memory region is used for a memory operation and/or one small memory region is used for a memory operation while another small memory region is also separately used for another memory operation, thereby simultaneously executing the data transfer operation and the memory operation and/or the memory operations.

In one embodiment of this invention, the first and second memory sections include different memory elements, and one of the first and second memory sections having a higher-write speed includes a plurality of small memory regions.

In one embodiment of this invention, the memory control section has an access operation section for limiting an access period for at least one of the first and second memory sections to a minimum of that required for each access operation, and a third memory section for storing predetermined memory data within the access period limited by the access operation section.

According to another aspect of the present invention, a semiconductor memory device comprises first and second memory sections including a plurality of memory elements, and a memory control section for allowing a data transfer operation between the first and second memory sections based on an external control command while allowing a memory operation to at least one of the first and second memory sections. The memory control section has an access operation section for limiting an access period for at least one of the first and second memory sections to a minimum of that required for each access operation. Thereby, the above-described object is achieved.

In one embodiment of this invention, the semiconductor memory device further comprises an access completion signal generation section for generating an access completion signal when an access is completed. The access operation receives the access completion signal and ends the access period started by an access permission signal. Thereby, the above-described object is achieved.

In one embodiment of this invention, the memory control section has a third memory section for storing predetermined memory data within the access period limited by the access operation section, and the memory control section executes a data read operation within the access period limited by the access operation section when data is read from at least one of the first and second memory sections, and stores the read data to the third memory section. Therefore, for example, data read by a read operation requested to the higher-write-speed memory is latched, thereby making it possible to efficiently perform an operation of the higher-write-speed memory.

In one embodiment of this invention, the memory elements included in the first and second memory sections are of different types, and the memory control section reads data from one of the first and second memory sections having a higher-write speed.

In one embodiment of this invention, the memory control section writes data to at least one of the first and second memory sections within the access period limited by the access operation.

In one embodiment of this invention, the semiconductor memory device is integrated into a single semiconductor chip.

According to another aspect of the present invention, an information apparatus is provided in which the above-described semiconductor memory device is used to execute at least one of a data transfer operation and a memory operation, or at least two memory operations within an access period.

According to another aspect of the present invention, a method is provided for determining an access period for a semiconductor memory device. When an access is completed, an access completion signal is generated, and when the access completion signal is received, the access period started by an access permission signal is ended.

Functions of the present invention will be described below. One of the first and second memory sections which has a greater write speed is composed of a plurality of small memory regions in which a memory operation and a data transfer operation are separately carried out. The present invention provides a memory control section which enables simultaneous memory operations to the regions where one region is used for a data transfer operation while another region is separately subjected to an external access operation. Therefore, it is possible to simultaneously carry out a memory operation by an external control command and a data transfer operation by another control command in parallel. Further, memory operations by respective separate control commands can be simultaneously carried out in parallel.

Further, the memory control section limits an access period to a period for which a memory array is actually activated. Therefore, a memory operation and a data transfer operation, or separate memory operations can be efficiently carried out for an access period which is limited to the minimum of that required for each access operation. Therefore, for example, data read from a high write-speed memory in response to a read operation is latched so that the high write-speed memory can be efficiently operated.

Further, if a section comprising a plurality of regions in which a high-write-speed region can be separately operated, and a section for limiting a period, for which a memory array in the high-write-speed memory section is activated, to the minimum of that required are simultaneously used, access operations can be more efficiently carried out.

In any of the above-described cases, the probability that an external memory operation and a data transfer operation conflict can be reduced. Therefore, it is possible that a reduction in speed of a data transfer operation can be inhibited while priority is given to an external memory operation, or the probability that an external memory operation is interrupted can be reduced while priority is given to a data transfer operation.

Thus, the invention described herein makes possible the advantages of providing a semiconductor memory device capable of reducing a probability of confliction between an external memory operation and a data transfer operation, and an information apparatus using the semiconductor memory device, and a method for determining an access period for the semiconductor memory device.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
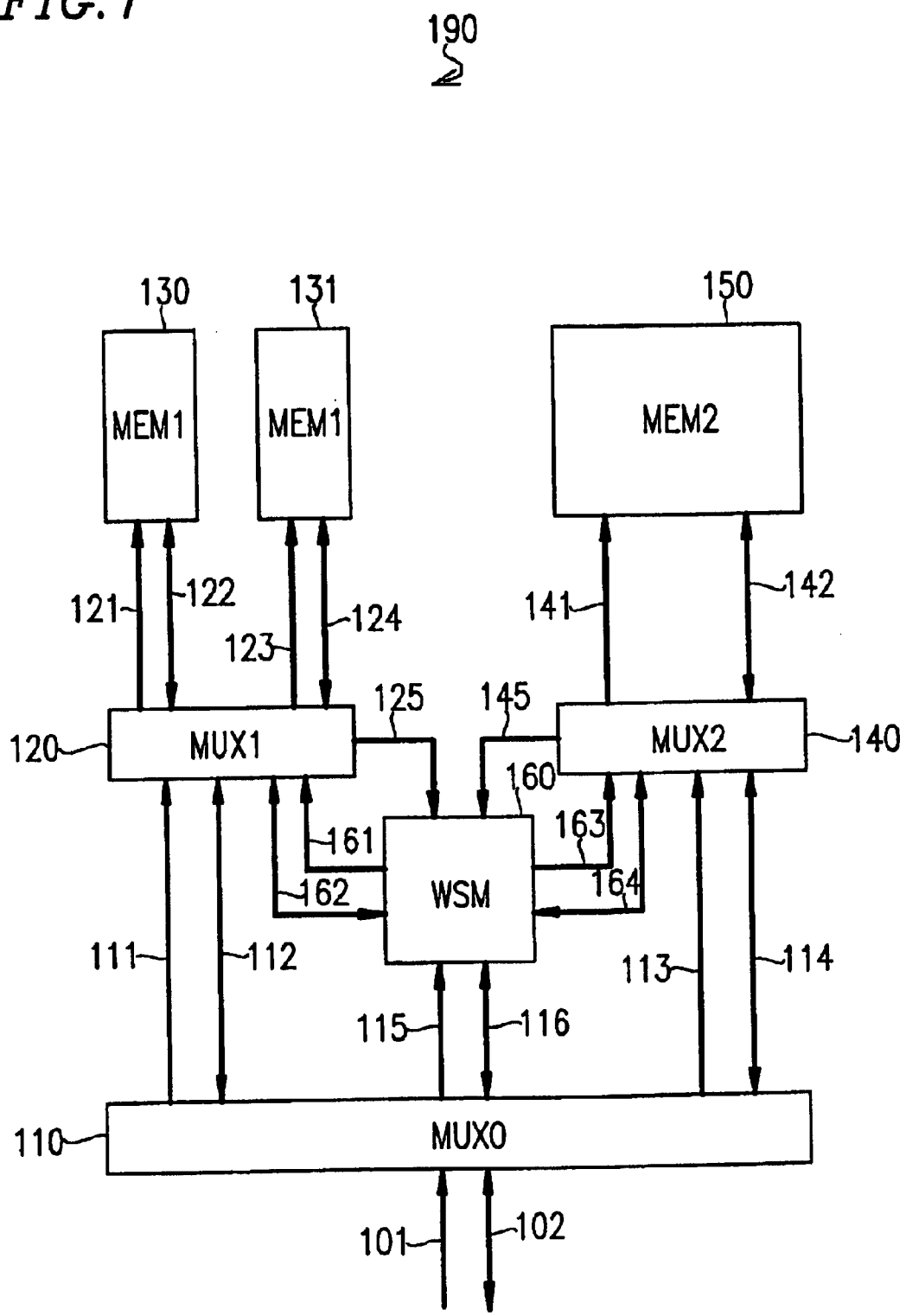
FIG. 1 is a block diagram showing an exemplary configuration of major parts of a semiconductor memory device according to Example 1 of the present invention.

FIG. 1 is a block diagram showing an exemplary configuration of major parts of a semiconductor memory device according to Example 1 of the present invention. It should be noted that FIG. 1 shows only parts of the semiconductor memory device of the present invention which are necessary for explaining the present invention. A configuration of a semiconductor memory device 190 shown in FIG. 1 is an exemplary configuration of the semiconductor memory device of the present invention. Other configurations may be possible, such as, for example, at least a portion of a data bus may be divided into a data input bus and a data output bus, the content of data via a data bus may be utilized as a control signal, data may be transferred without need of a write state machine (hereinafter referred to as WSM) during a transfer operation, and the like. Example 1 of the present invention is not limited to the configuration of FIG. 1. Among specific operations of the semiconductor memory device 190, operations different from those described in the conventional semiconductor memory device 490 are mainly described.

In FIG. 1, the semiconductor memory device 190 of the present invention comprises memory blocks 130 and 131 as a high write-speed first memory section, a memory block 150 as a low write-speed second memory section, and a memory control section (comprising switching circuits 110, 120 and 140, a WSM 160 and control buses and data buses therebetween). The memory control section is capable of carrying out data transfer operations between one of the memory blocks 130 and 131 and the memory block 150 based on external access operations. The memory control section also carries out memory operations, such as read, write and delete operations, and the like for the other of the memory blocks 130 and 131. Here, the memory control section can simultaneously carry out a data transfer operation and a memory operation by, for example, using the memory block 130 for a data transfer operation (or data read operation) and the memory block 131 for a memory operation (i.e., read or write).

Hereinafter, the semiconductor memory device 190 of the present invention will be described in further detail.

When the switching circuit 120 is externally instructed by the switching circuit 110 via a control bus 111 to perform an access operation to a high write-speed memory (memory blocks 130 and 131), the switching circuit 120 judges whether memory elements designated by the access operation are contained in the memory block 130 or the memory block 131, based on an address signal on an address bus contained in the control bus 111. When the access operation is directed to the memory block 130, the contents of the access operation are carried out for the memory elements designated by the access operation using a control bus 121 and the data bus 122. When the access operation is directed to the memory block 131, the contents of a control command are carried out for the memory elements designated by the access operation using a control bus 123 and a data bus 124.

When the designated access operation is a read operation (memory operation), read data is transferred via a data bus 112 from the switching circuit 120 to the switching circuit 110, and the switching circuit 110 outputs the read data outside via a data bus 102. Thus, an access operation to a high write-speed memory (memory block 130 and 131) can be externally carried out.

Next, during a data transfer operation, if the switching circuit 120 is instructed by a control signal 161 to perform an access operation to a high write-speed memory, the switching circuit 120 judges whether memory elements designated by the access operation are contained in the memory block 130 or the memory block 131, based on an address signal on an address bus contained in the control bus 161.

When the access operation is directed to the memory block 130, the designated operation is carried out for the memory elements designated by the access operation using a control bus 121 and the data bus 122. When the access operation is directed to the memory block 131, the designated operation is carried out for the memory elements designated by the access operation using a control bus 123 and a data bus 124.

If the designated access operation is a read operation, read data is transferred from the switching circuit 120 via a data bus 162 to the WSM 160. Therefore, an access operation to a high write-speed memory can be carried out during a data transfer operation.

The memory blocks 130 and 131 can be separately operated. Therefore, it is possible that while any one of the memories (e.g., the memory block 130) is subjected by the WSM 160 to an access operation during a data transfer operation, the other memory (e.g., the memory block 131) can be subjected to an external access operation using a control bus 101 and a data bus 102.

When a conflict occurs between access operations (a data transfer operation and a read operation, or the like) to any one of the memory blocks 130 and 131, the access operations cannot be simultaneously carried out similar to when access operations to the memory 430 conflict in the conventional semiconductor memory device 490. However, the switching circuit 120 carries out a control command (e.g., data transfer operation or a memory operation) having higher priority using the control bus 121 and the data bus 122 (memory block 130), or the control bus 123 and the data bus 124 (memory block 131), and transfers to the WSM 160 using a judgment signal 125 that there is a possibility that an operation having lower priority was not normally completed.

As described above, in the semiconductor memory device 190 of Example 1, for example, the memory block 131 is subjected to an external access operation (memory operation) while the memory block 130 is used for a data transfer operation. Therefore, for example, a high write-speed memory can be used as a working memory without affecting a data transfer operation. Further, by writing next data to be transferred into a high write-speed memory along with a data transfer operation, the semiconductor memory device can be ready to start a next data transfer operation immediately after the previous data transfer operation is completed.

As described above, in a semiconductor memory device having a function of transferring data between two memory regions (the memory blocks 130 and 131 and the memory block 150), a more efficient access operation to a high write-speed memory (the memory blocks 130 and 131) and a more efficient data storage to a low write-speed memory (the memory block 150) can be achieved in addition to a general-purpose use of the device.

In Example 1, the first memory section is a high write-speed memory comprising a plurality of separately operable regions (the memory blocks 130 and 131). It should be noted that the second memory section, i.e., a low write-speed memory (the memory block 150) may have a similar configuration. With such a configuration, at least one of external memory operations, i.e., reading and writing, to a low write-speed memory data transfer operation can be carried out without affecting a data transfer operation.

In Example 1, the high write-speed first memory section is divided into two small memory regions, i.e., the memory blocks 130 and 131 which can be separately operated, but may be divided into 3 or more memory blocks.

EXAMPLE 2

Figure 2:
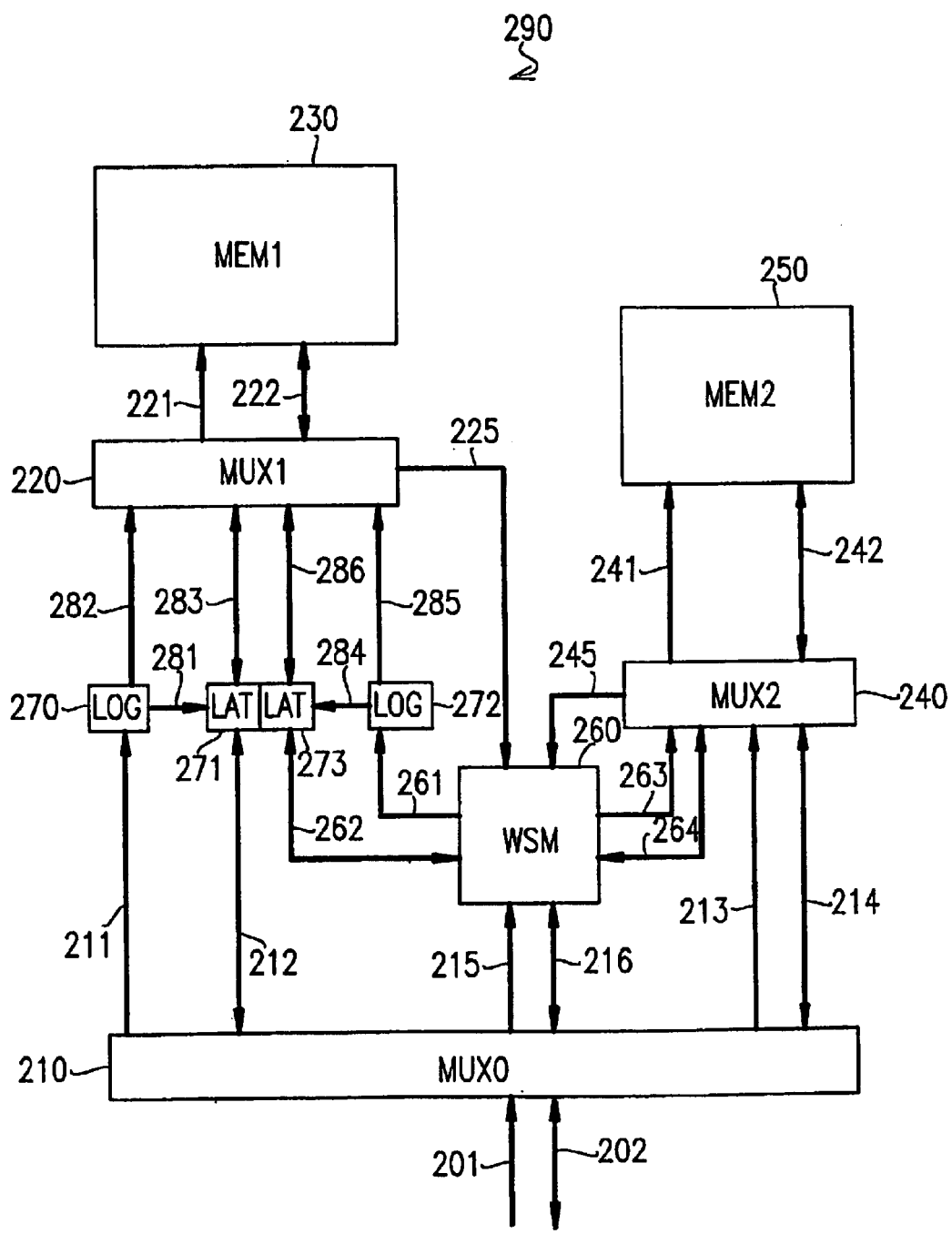
FIG. 2 is a block diagram of an exemplary configuration of a semiconductor memory device according to Example 2 of the present invention, showing major parts thereof.

FIG. 2 is a block diagram of an exemplary configuration of a semiconductor memory device according to Example 2 of the present invention, showing major parts thereof. It should be noted that FIG. 2 shows only parts of the semiconductor memory device of the present invention which are necessary for explaining the present invention. A configuration of a semiconductor memory device 290 shown in FIG.

2 is an exemplary configuration of the semiconductor memory device of the present invention. Example 2 of the present invention is not limited to the configuration of FIG. 2. Among specific operations of the semiconductor memory device 290, operations different from those described in the conventional semiconductor memory device 490 are mainly described.

In FIG. 2, the semiconductor memory device 290 of the present invention comprises a memory blocks 230 as a high write-speed first memory section, a memory block 250 as a low write-speed second memory section, and a memory control section. The memory control section is capable of carrying out data transfer operations between the memory block 230 and the memory block 250 based on an external control command. The memory control section also carries out memory operations, such as read, write, delete operations, and the like for the memory block 230.

The memory control section comprises switching circuits 210, 220 and 240, a WSM 260, and control buses and data buses therebetween. The memory control section further comprises a control circuit 270 as a time-setting section for controlling the timing of delay and the like, a data latch circuit 271 as a third memory section between the switching circuit 220 and the switching circuit 210, a control circuit 272 as a time-setting section for controlling the timing of delay and the like, and a data latch circuit 273 as a third memory section between the switching circuit 220 and the WSM 260. When the memory control section is instructed to perform an access operation to the memory block 230, the access operation is internally ended after a certain period (an access period limited to the minimum of that required for each access operation) passes. Even if a next access operation continuously follows, the next access operation can be carried out in the present invention. To this end, peripheral circuits are used to allow the semiconductor memory device 290 to behave in a manner such that the next access operation is seemingly continuous to the previous access operation.

Hereinafter, a specific example of the control circuit 270 or 272, which are characteristic features of the present invention, will be described.

Figure 3:
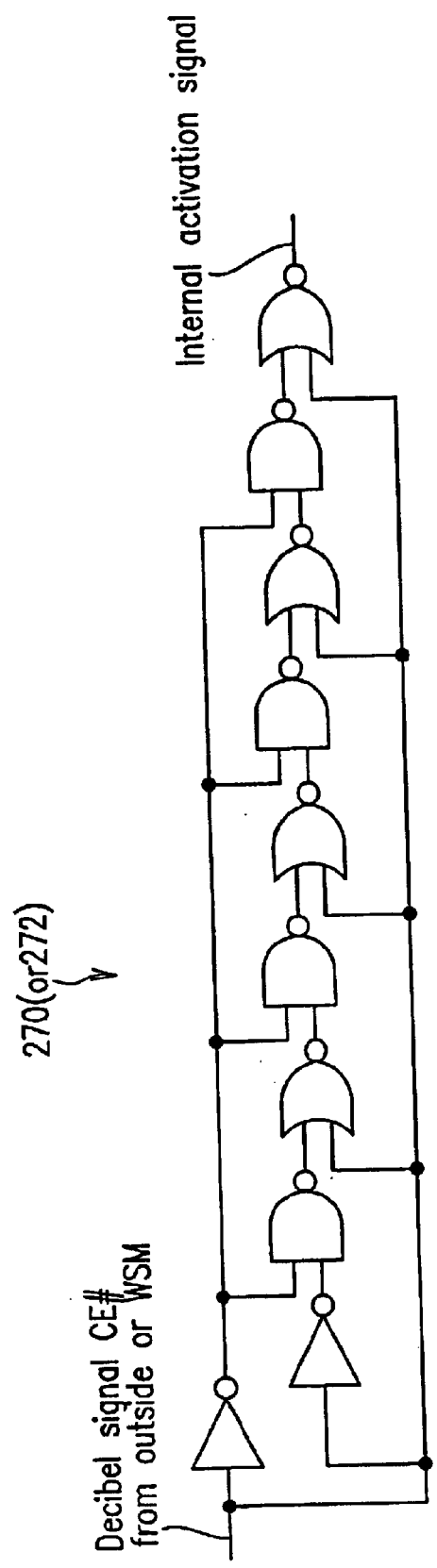
FIG. 3 is a circuit diagram showing a specific exemplary configuration of a control circuit of FIG. 2.
Figure 4:
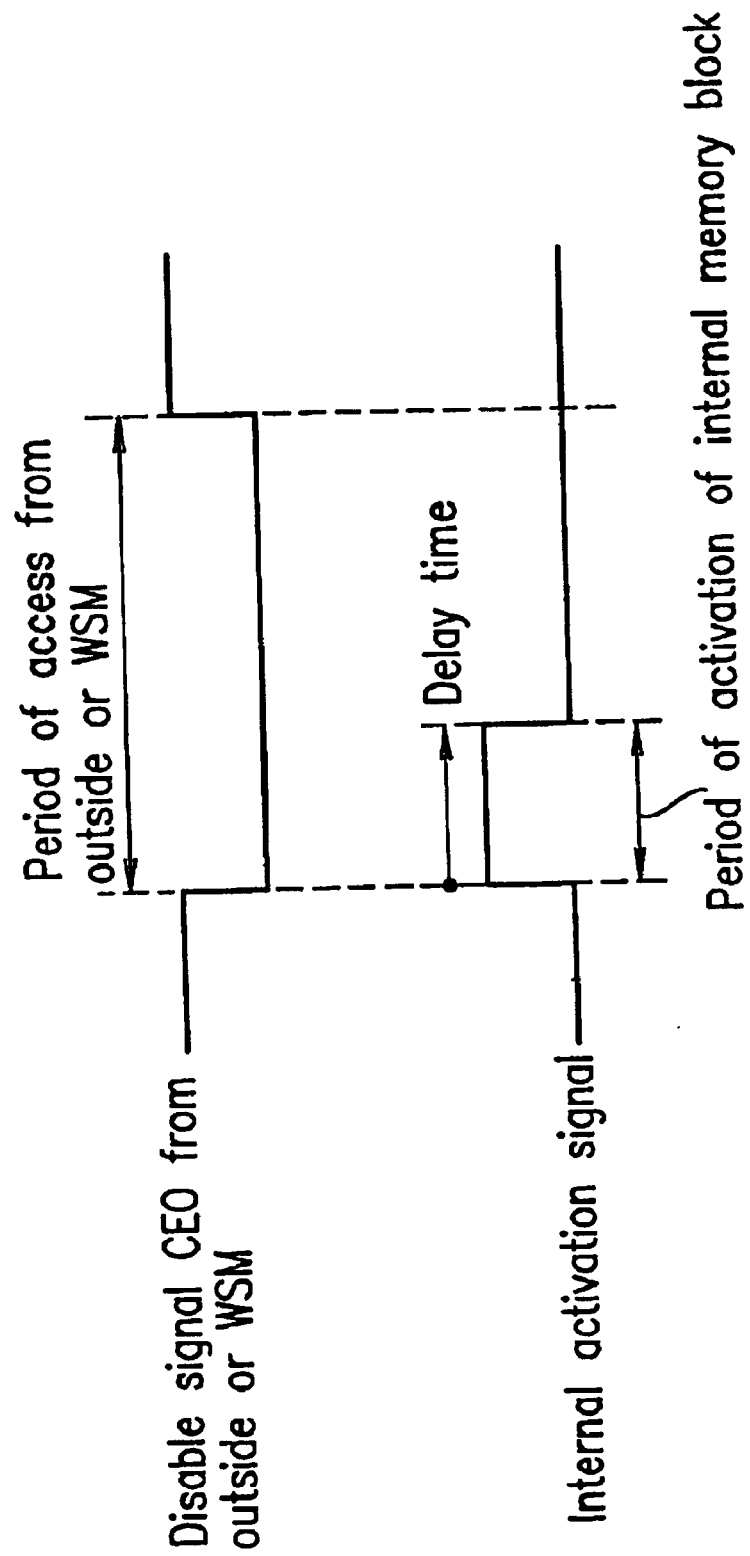
FIG. 4 is a diagram showing signal waveforms at the input and output terminals of the control circuit of FIG. 3.

FIG. 3 is a circuit diagram showing a specific exemplary configuration of the control circuit 270 or 272 of FIG. 2. FIG. 4 is a diagram showing signal waveforms at the input and output terminals of the control circuit of FIG. 3. As shown in FIGS. 3 and 4, the control circuit 270 or 272 outputs an internal activation signal, which is maintained at a high level for a predetermined period, in synchronization with the falling of a disable signal CE# from the outside or the WSM 260 (i.e., a memory is enabled at a low level). The predetermined period for which the internal activation signal is maintained at the high level (delay period; the minimum of a required access period) is determined by delays of transistors contained in the circuit. Therefore, the delays of the transistors have to be adjusted so that a sufficient period for completion of an access operation to a memory (an access period is limited to the minimum of that required for each access operation) can be secured. It should be noted that the external disable signal CE# is transferred from the switching circuit 210 to the control circuit 270, and the disable signal CE# from the WSM 260 is transferred from the WSM 260 to the control circuit 272.

It should be noted that another example of the control circuit 270 or 272 of FIG. 2 will be described with reference to FIGS. 5 and 6. Here, an access period is determined as follows. When an access is completed, an access completion signal is generated. When the access completion signal is received, the access period which has been started by an access permission signal is ended. In this case, an access completion signal generating section may be provided in the memory block 230 (at least one of the first and second memory sections) or the switching circuit 220. The access completion signal may be generated by monitoring the activation state of the memory block 230.

Figure 5:
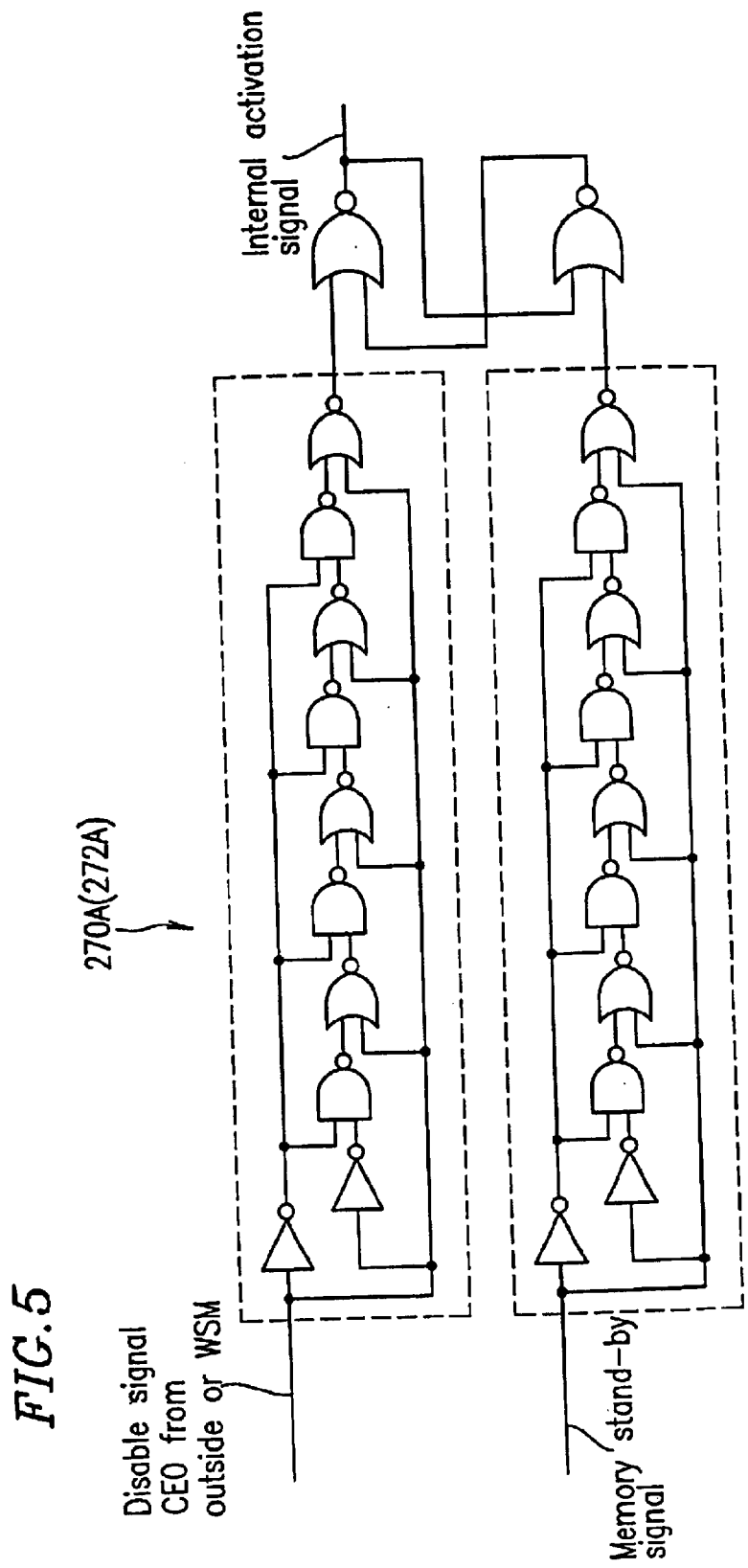
FIG. 5 is a circuit diagram showing another specific exemplary configuration different from that of the control circuit of FIG. 3.
Figure 6:
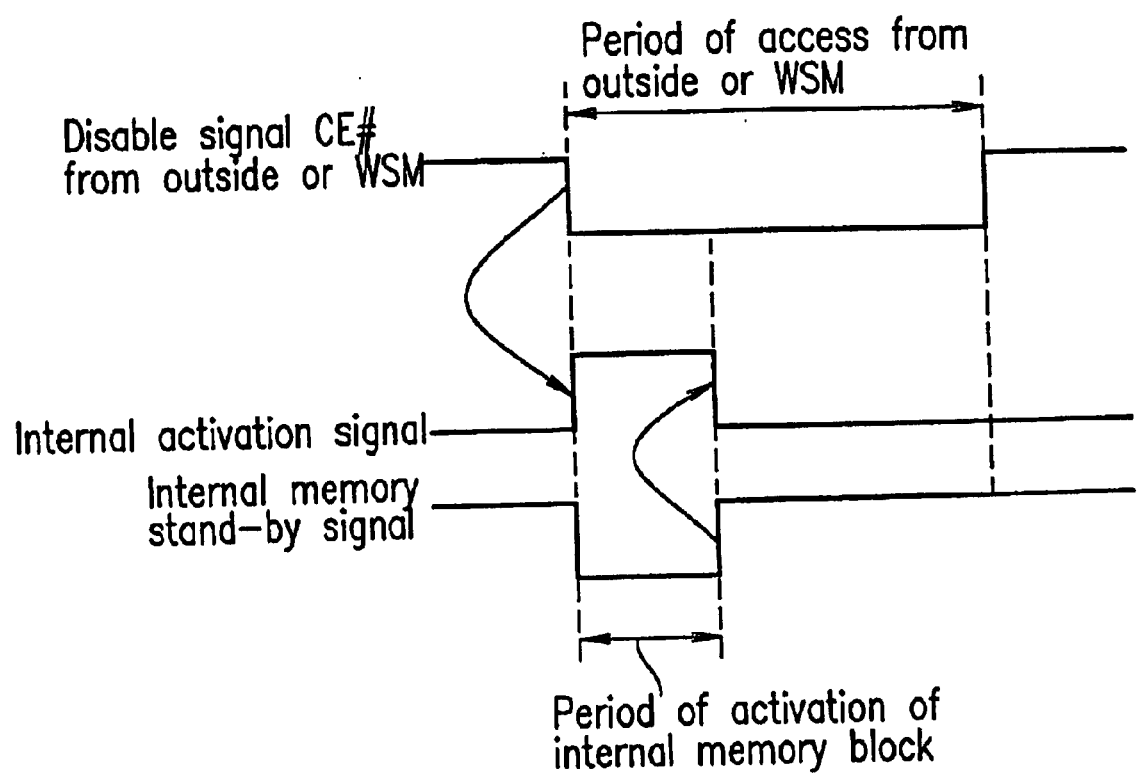
FIG. 6 is a diagram showing signal waveforms at the input and output terminals of the control circuit of FIG. 5.

FIG. 5 is a circuit diagram showing another specific exemplary configuration different from that of the control circuit of FIG. 3. FIG. 6 is a diagram showing signal waveforms at the input and output terminals of the control circuit of FIG. 5. The control circuit 270 or 272 having a circuit shown in FIG. 5 is called control circuit 270A or 272A. As shown in FIGS. 5 and 6, the control circuit 270A or 272A outputs an internal activation signal which rises (goes high) in synchronization with the falling of a disable signal CE# (i.e., a memory is enabled at a low level) as an access permission signal from the outside or the WSM 260, and falls in synchronization with the rising of a stand-by signal of an internal memory which has risen in synchronization with the falling of the disable signal CE#. When the internal enable signal goes high, access to the internal memory is started and at the same time, the stand-by signal is caused to fall. When the access is completed, the stand-by signal is caused to rise. It should be noted that the external disable signal CE# is transferred from the switching circuit 210 to the control circuit 270, and the disable signal CE# from the WSM 260 is transferred from the WSM 260 to the control circuit 272. The stand-by signal of the internal memory is transferred from the memory block 230 to the switching circuit 220, and then to any of the control circuits 270A and 272A. The stand-by signal is used as the access completion signal.

In the control circuit 270 or 272 of FIG. 3, it is necessary to use delays to secure a period for which an access is certainly completed. Therefore, in order to secure a sufficient margin, it is necessary to activate a sufficient period relative to an access time (an access period limited to the minimum of that required for each access operation). However, in the control circuit 270A or 272A of FIG. 5, a period for which the internal memory is activated (an access period limited to the minimum of that required for each access operation) can be further reduced to the minimum, thereby further improving the efficiency of data transfer. It should be noted that it is sufficient for a delay circuit shown in FIG. 5 to produce a time required for a flip-flop (two NOR gate circuits at the right end of the circuit of FIG. 5) at a later stage of the circuit to be inverted, as is different from the circuit of FIG. 3.

Hereinafter, the semiconductor memory device 290 of the present invention will be described in more detail.

When a data read operation from the memory block 230 is externally carried out, the switching circuit 210 is instructed via a control bus 201 to read data from the memory block 230.

If the designated data read operation is directed to the memory block 230, the switching circuit 210 instructs the control circuit 270 via a control bus 211 to perform a read operation.

The control circuit 270 instructs the switching circuit 220 via a control bus 282 to perform a read operation from the memory block 230, and outputs a data latch control signal 281 to the data latch circuit 271.

When the switching circuit 220 is instructed by the control circuit 270 to perform a read operation from the control bus 282, the switching circuit 220 instructs the memory block 230 via a control bus 221 to perform a data read operation and receives read data from the memory block 230 via a data bus 222 and transfers the read data via a data bus 283 to the data latch circuit 271.

The data latch circuit 271 is controlled using the data latch signal 281 generated by the control circuit 270. When a read operation is externally carried out, read data is transferred via a data bus 212 to the switching circuit 210. After a predetermined period has passed from the start of the read operation, the data transferred from the data bus 283 is latched. The latched data is transferred via the data bus 212 to the switching circuit 210 at least until the external read operation is ended. The switching circuit 210 outputs the received data outside via a data bus 202.

A series of the above-described operations allows a data read operation from the memory block 230. In this read operation, a period for which data is actually read after activation of the memory block 230 is a predetermined period from the start of the reading (an access period limited to the minimum of that required for each access operation). After such a period has passed, the read operation from the memory block 230 is ended and the control bus 221 and the data bus 222 are released.

It should be noted that after the memory block 230 is inactivated, the data latch circuit 271 latches read data, and the switching circuit 210 receives the read data while external reading is continued, and outputs the data outside. Therefore, it seems from the outside that data read is always carried out while the semiconductor memory device 290 is externally instructed to perform a read operation.

This operation can actually reduce and limit a period for activating the high-reading-speed memory block 230 even when the memory device 290 is externally instructed to perform a read control operation for a long time. Therefore, for example, the possibility that a conflict occurs between a data transfer operation and an access operation from the WSM 260 can be reduced.

Hereinafter, the effect of the present invention of reducing the possibility of a normal confliction between a memory operation including a read operation, and a data transfer operation, or the possibility of a normal conflict between memory operations will be described.

Figure 7:
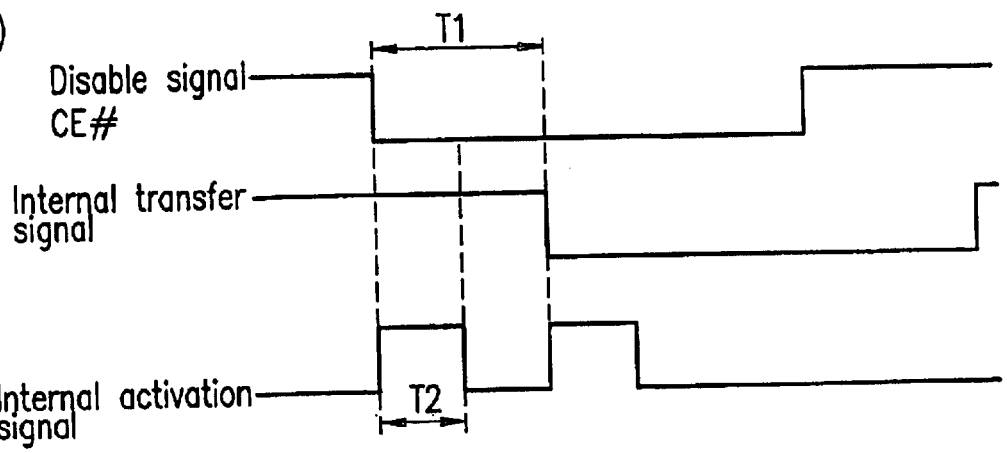
FIGS. 7A and 7B are timing charts showing the status of an internal activation signal when a disable signal CE# overlaps with the internal transfer signal.
FIG. 7C is a timing chart showing the status of an internal activation signal when, while a first memory operation is carried out, a second memory operation is carried out multiple times.
Figure 7:
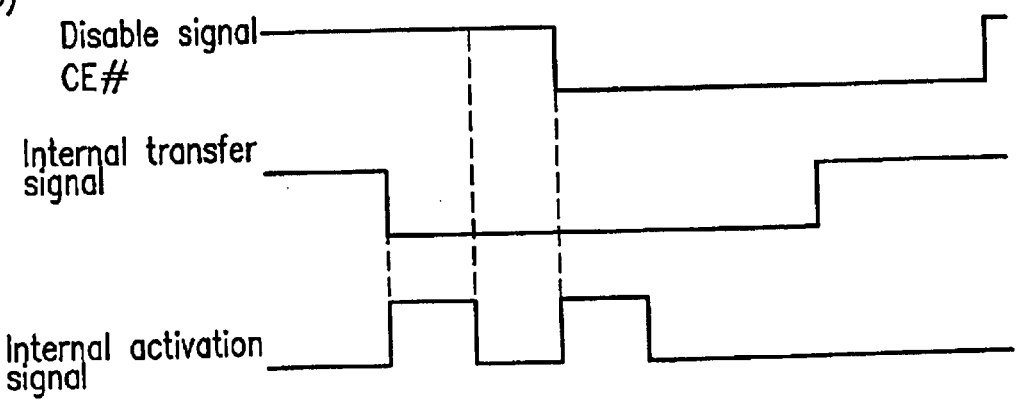
Figure 7:
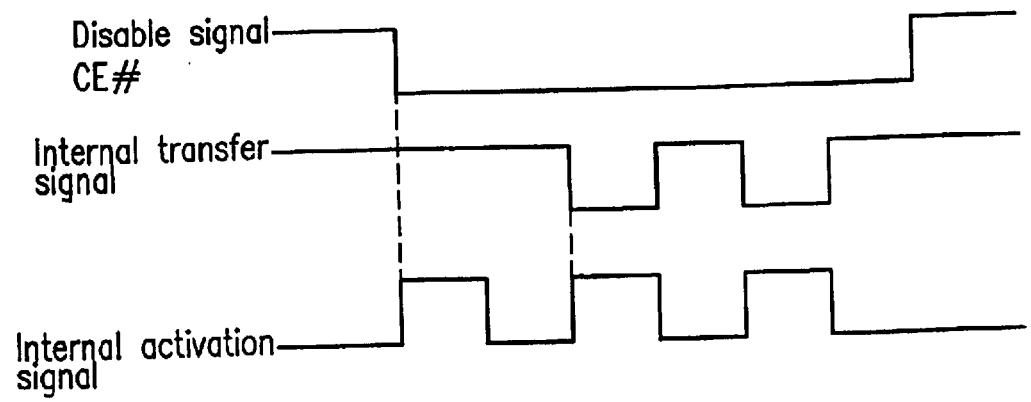

When, as shown in FIGS. 7A and 7B, the disable signal CE# (memory operation) and an internal transfer signal (data transfer operation) conflict, or when, as shown in FIG. 7C, while one of memory operations (external operation and WSM) is carried out, the other memory operation is carried out multiple times, even though the disable signal CE# is in a low level period (high-level period of the enable signal CE), for example, the internal activation signal for the disable signal CE# and an internal activation signal for the internal transfer signal (which is at the LOW level for a period for requesting access, similar to the disable signal CE#) can be used to activate the memory block 230 continuously in a time sense, and carry out an access operation to the memory block 230. In this case, conventionally, the internal activation signal cannot be activated (HIGH level) for a time during which the disable signal CE# and the internal transfer signal conflict. In the present invention, even when the disable signal CE# and the internal transfer signal conflict as described above, the internal activation signal can be activated (HIGH level), thereby reducing the above-described probability of conflict.

In this case, the external disable signal CE# is transferred from the switching circuit 210 to the control circuit 270, while the disable signal CE# from the WSM 260 is transferred from the WSM 260 to the control circuit 272. Further, the internal transfer signal is transferred from the WSM 260 via the control circuit 272 to the switching circuit 220. The internal activation signal is raised by any of the disable signal CE# and the internal transfer signal, and after a predetermined time has passed (or by the edge of the stand-by signal of FIG. 6 from the memory block 230), the internal activation signal is caused to fall, whereby an access period is limited to the minimum of that required for each access operation. Hereinafter, each of FIGS. 7A to 7C will be specifically described.

As shown in FIG. 7A, when the disable signal CE# precedes but overlaps with the internal transfer signal, the internal activation signal is raised for a predetermined time in synchronization with the falling of the disable signal CE# (memory operation), and the internal activation signal is raised in synchronization with the falling of the internal transfer signal (data transfer operation). When a period T1 which is a time gap between the disable signal CE# and the internal transfer signal is longer than a predetermined activation period T2 of the internal activation signal, the internal activation signal for the disable signal CE#, and the internal activation signal for the internal transfer signal can be used to activate the memory block 230 continuously in a time sense. In this case, if it is assumed that the high-level period T2 of the internal activation signal is about ⅕ of the low level period of the disable signal CE# and the internal transfer signal, the present invention can be used to achieve a memory operation or a data transfer operation even when another disable signal CE# or internal transfer signal overlaps or conflicts with the remaining ⅘ of the low-level periods of the disable signal CE# and the internal transfer signal. Therefore, a success rate of about 80% can be roughly estimated.

As shown in FIG. 7B, when the internal transfer signal precedes but overlaps with the disable signal CE#, an internal activation signal is raised for a predetermined time in synchronization with the rising of the internal transfer signal, while the internal activation signal is raised for a predetermined time in synchronization with the falling of the disable signal CE#. In this case, when a period of a gap between the internal transfer signal and the disable signal CE# is longer than a predetermined activation period of the internal activation signal, an internal activation signal for the disable signal CE# and an internal activation signal for the internal transfer signal can be used to activate the memory block 230 continuously in a time sense.

As shown in FIG. 7C, when one memory operation (in this example, an external disable signal CE#) is being carried out and at the same time the other memory operation (in this example, an internal transfer signal from WSM) is being carried out multiple times, a first internal activation signal is raised for a predetermined time in synchronization with the falling of the disable signal CE#, and in synchronization with the subsequent two times of falling of the internal transfer signal, second and third internal activation signals are raised for a predetermined time. In this case, the operation of the internal transfer signal for a period for which an operation using the disable signal CE# is carried out cannot be executed by conventional techniques even though any number of requests are received if an external access has priority over a transfer operation. In the example of the present invention, the memory block 230 can be activated continuously in a time sense.

Next, when a data write operation to the memory block 230 is externally carried out, the switching circuit 210 is instructed via the control bus 201 to write data to the memory block 230, and the data to be written is input via the data bus 202 to the switching circuit 210.

When the designated write operation is directed to the memory block 230, the switching circuit 210 instructs the control circuit 270 via the control bus 211 to perform the write operation and transfers data to be written via the data bus 212 to the data latch circuit 271.

The control circuit 270 instructs the switching circuit 220 via the control bus 282 to perform a write operation, in which the data latch control signal 281 is output to the data latch circuit 271, and data input from the data bus 212 to the data latch circuit 271 is transferred via the data bus 283 to the switching circuit 220.

When the switching circuit 220 is instructed by the control circuit 270 via the control bus 282 to perform a write operation, the switching circuit 220 writes data to designated memory elements in the memory block 230 using the control bus 221 and the data bus 222. A series of the above-described operations make up the external write operation to the memory block 230.

In this write operation, a period for which the memory block 230 is actually activated and a data operation is carried out is limited to a predetermined time from the start of the write operation (an access period limited to the minimum of that required for each access operation). After such a period has passed, the write operation of the memory block 230 is ended. Thereafter, the control bus 211 or the data bus 212 is released.

Therefore, after the internal write operation is ended, a write operation, such as writing of next data from the outside, writing of transferred data read from a memory block 250, or the like can be started. It is possible to perform a read operation from the memory block 250 and a write operation without the WSM 260.

It should be noted that the data write operation is carried out where the data bus 212 and the data bus 283 are shared by the data read operation. In the case of an external write operation, a simpler configuration can be used, in which data to be written is transferred directly from the switching circuit 210 to the switching circuit 220 but not via the data latch circuit 271.

Next, an access operation to the memory block 230 during a data transfer operation will be described.

A data transfer operation is required mainly when data is transferred from a high write-speed memory (memory block 230) to a low write-speed memory (memory block 250). In Example 2, data is transferred from the memory block 230 to the memory block 250. Firstly, such an operation will be described.

When the WSM 260 is instructed via a control bus 215 and a data bus 216 to perform a data transfer operation from the memory block 230 to the memory block 250, the WSM 260 instructs the control circuit 272 via a control bus 261 to read data to be transferred from the memory block 230.

The control circuit 272 instructs the switching circuit 220 via a control bus 285 to read data from the memory block 230, and outputs a latch control signal 284 to a data latch circuit 273 to instruct the data latch circuit 273 to transfer the data, which has been output from the switching circuit 220 via a data bus 286 to the data latch circuit 273, via a data bus 262 to the WSM 260.

When the switching circuit 220 is instructed via the control bus 285 to perform a read operation, the switching circuit 220 accesses designated memory elements of the memory block 230 via the control bus 221 and receives data from the data bus 222, and transfers the data via the data bus 286 to the data latch circuit 273.

The data latch circuit 273 temporarily latches the data transferred from the data bus 286 due to the latch control signal 284 and transfers the data via the data bus 262 to the WSM 260.

The WSM 260 receives the transferred data via the data bus 262, and writes the data to the memory block 250. This write operation can be achieved by conventional methods, and description thereof is therefore omitted.

After a predetermined time has passed from the receipt of a read instruction, the control circuit 272 uses the data latch control signal 284 to latch the read data transferred via the data bus 286 to the latch circuit 273, and outputs the latched data via the data bus 262 to the WSM 260 until the read control via a control bus 261 is ended.

Further, even when the designated read control is continued, if a predetermined time has passed, the control circuit 272 ends a read operation designated via the control bus 285 to the switching circuit 220.

A subsequent data output operation to the WSM 260 is carried out by the data latch circuit 273 using the data bus 262. The timing of data latching by the data latch circuit 273 is carried out using the latch control signal 284 generated by the control circuit 272.

With such an operation by the control circuit 272, the WSM 260 can be handled as if a read operation is continued for a designated period, and, even when a period required for an access operation from the WSM 260 is long, a period for which the control bus 221 and the data bus 222 are used for a read operation from the WSM 260 (an access period limited to the minimum of that required for each access operation) is suppressed to a certain level or less.

Therefore, even when an access operation from the WSM 260 to the memory block 230, and an external access operation to the memory block 230 occurs simultaneously, it may be possible that both operations are seemingly simultaneously processed, thereby making it possible to achieve a data transfer operation which is not likely to depend on external situations.

Next, a direction opposite to the above-described data transfer direction will be described. Specifically, a data transfer operation from the memory block 250 to the memory block 230 will be described. This operation is different from the external data write operation to the memory block 230, only in that a different path is used, and description thereof is therefore omitted. Data to be written to the memory block 230 is latched in the data latch circuit 273, resulting in a different merit.

In the write operation, a period for which the memory block 230 is activated and data is actually written thereto is only a predetermined period from the start of the writing. After such a period has passed, the write operation to the memory block 230 is ended and the control bus 221 and the data bus 222 are released.

It should be noted that since data to be written is latched by the data latch circuit 271 if a predetermined time has passed, a period for which the WSM 260 activates the memory block 250 for a data transfer operation can be reduced to the minimum of that required for a read operation. After the read operation, since a control bus 241 and a data bus 242 are released, an external access operation to the memory block 250 is made possible.

Thus, by latching data to be written, an access operation to the memory block 250 is made efficient.

As described above, according to Example 2, in the semiconductor memory device 290 having a function of transferring data between two memory regions (the memory blocks 230 and 250), more general-purpose usage, a more efficient access operation to the high write-speed memory block 230, and a more efficient data storage to the low write-speed memory block 250 can be achieved.

It should be noted that in Example 2, although it is not specified, a period for which the control circuit 270 and the control circuit 272 actually carry out an access operation to the memory block 230 is a necessary and sufficient time for the access operation. However, accurate timing is not required. However, the period longer than what is required can result in a timing margin, but leads to a reduction in the merit obtained by the present invention. Therefore, it is necessary to define the period within an appropriate range.

Further, in Example 2, although an example in which the present invention is applied to the high write-speed memory block 230 is described, the configuration for limiting a period for which the memory block 230 is actually accessed can be applied to the low write-speed memory block 250.

EXAMPLE 3

Figure 8:
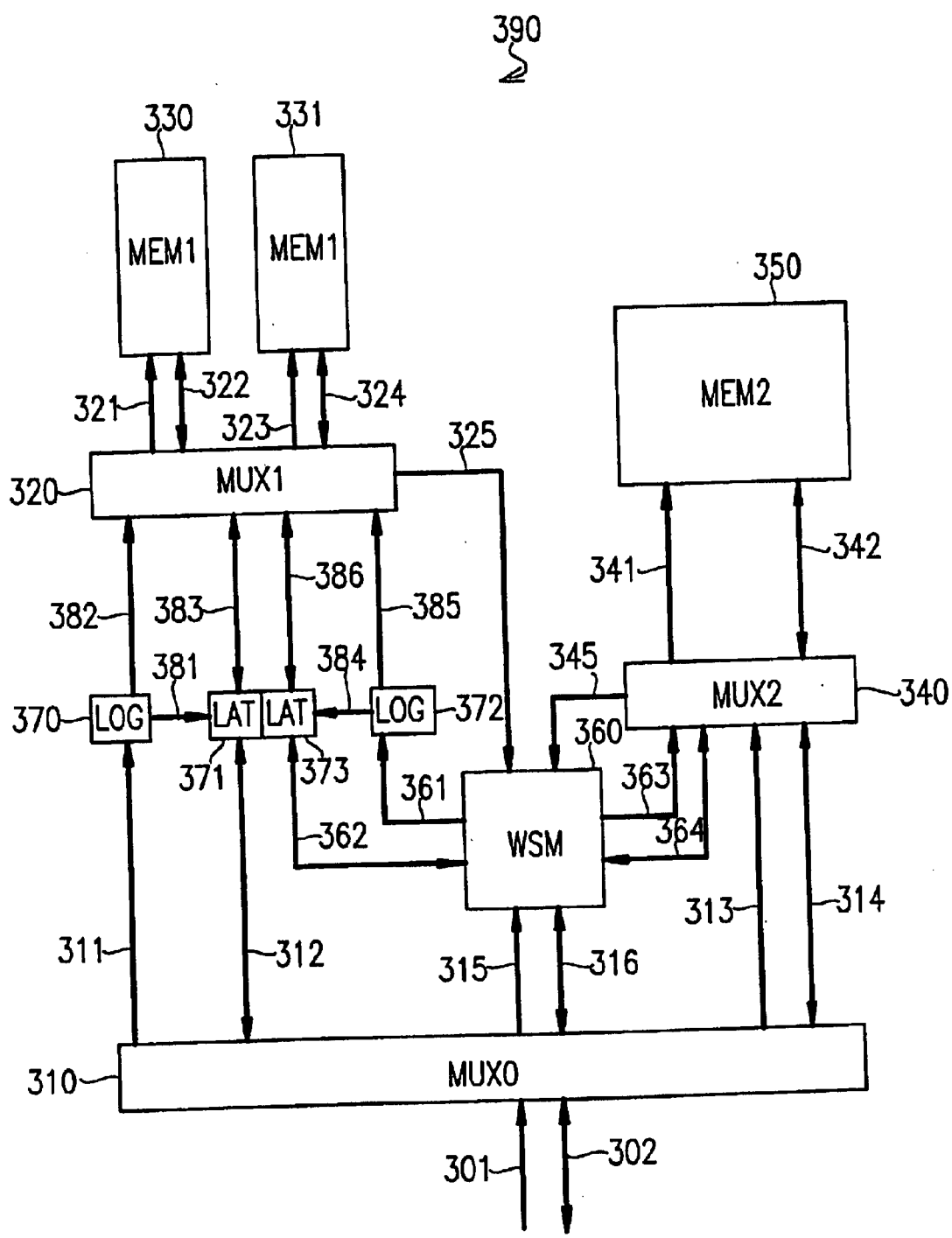
FIG. 8 is a block diagram of a semiconductor memory device according to Example 3 of the present invention, showing major portions thereof.

FIG. 8 is a block diagram of a semiconductor memory device according to Example 3 of the present invention, showing major portions thereof. It should be noted that FIG. 8 shows only portions thereof required for explanation of the semiconductor memory device of the present invention. A configuration of a semiconductor memory device 390 shown in FIG. 8 is an exemplary semiconductor memory device according to the present invention, but does not limit to the configuration of Example 3, similar to Examples 1 and 2. Further, high write-speed memory blocks 330 and 331 included in the semiconductor memory device 390 are two memory regions which can be separately operated, similar to the semiconductor memory device 190 described in Example 1. Further, the high write-speed memories included in the semiconductor memory device 390 are configured so that a period for which the high write-speed memory is actually accessed in the time of control, similar to the semiconductor memory device 290 described in Example 2, can be reduced.

Similar to Example 1, when the memory block 330 is used in a data transfer operation, an external access operation to the memory block 331 can be carried out separately from the data transfer operation. Therefore, the data transfer operation is not affected by the external access operation. Further, if when the memory block 330 is used in a data transfer operation, the memory block 330 is also externally controlled (memory operation), both operations can be seemingly simultaneously controlled similar to Example 2. With this configuration, an external access operation (memory operation) is not likely to affect a data transfer operation.

As described above, according to Example 3, in the semiconductor memory device 390 having a function of transferring data between two memory regions (the memory blocks 330 and 331), more general-purpose usage, a more efficient access operation to the high write-speed memory blocks 330 and 331, and a more efficient data storage to the low write-speed memory block 350 can be achieved.

As described above, according to the present invention, in a semiconductor memory device in which a data transfer operation for transferring stored data to another address and a memory operation for controlling memory regions used for the data transfer operation using a command from outside the semiconductor memory device are carried out, when the data transfer operation and the external memory operation, or the memory operations are carried out in parallel, even if a conflict occurs between the operations (a conflict between the disable signal CE# and the internal transfer signal), the operations can be efficiently controlled.

It should be noted that although it is not specified in Example 3, as described in Example 1, the low write-speed memory block 350 may comprise a plurality of regions which can be separately operated. As described in Example 2, a period for which the low write-speed memory block 350 may also be limited. To which memory blocks and to what extent the present invention is applied is a trade off between performance and circuit scale, which is a problem to be examined based on the specification or application of a device.

Further, although it is not specified in Examples 1 to 3, the semiconductor memory devices shown in FIGS. 1, 2 and 8 may be integrated into a single semiconductor chip for the purpose of achieving a higher-speed operation.

Figure 9:
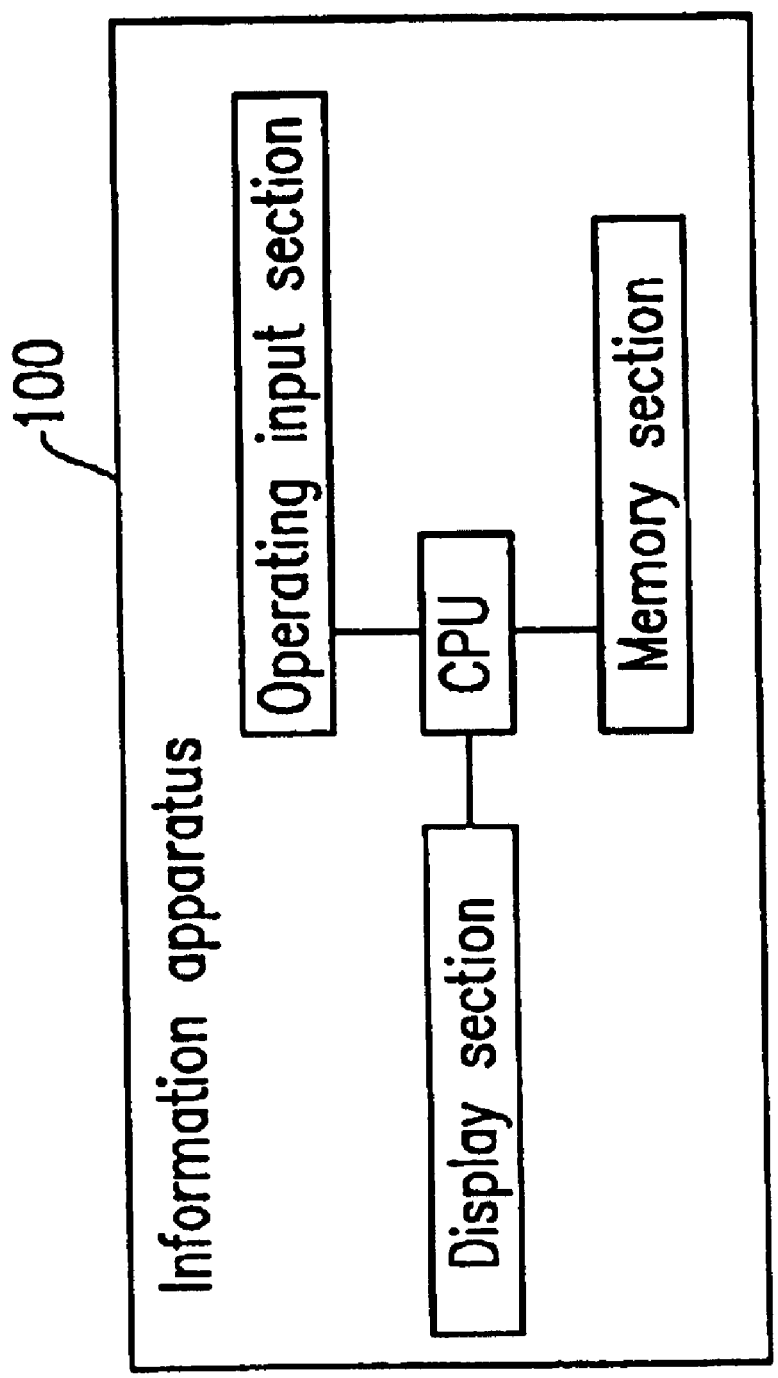
FIG. 9 is a block diagram showing a basic configuration of an information apparatus to which the semiconductor memory device of the present invention is applied.
Figure 10:
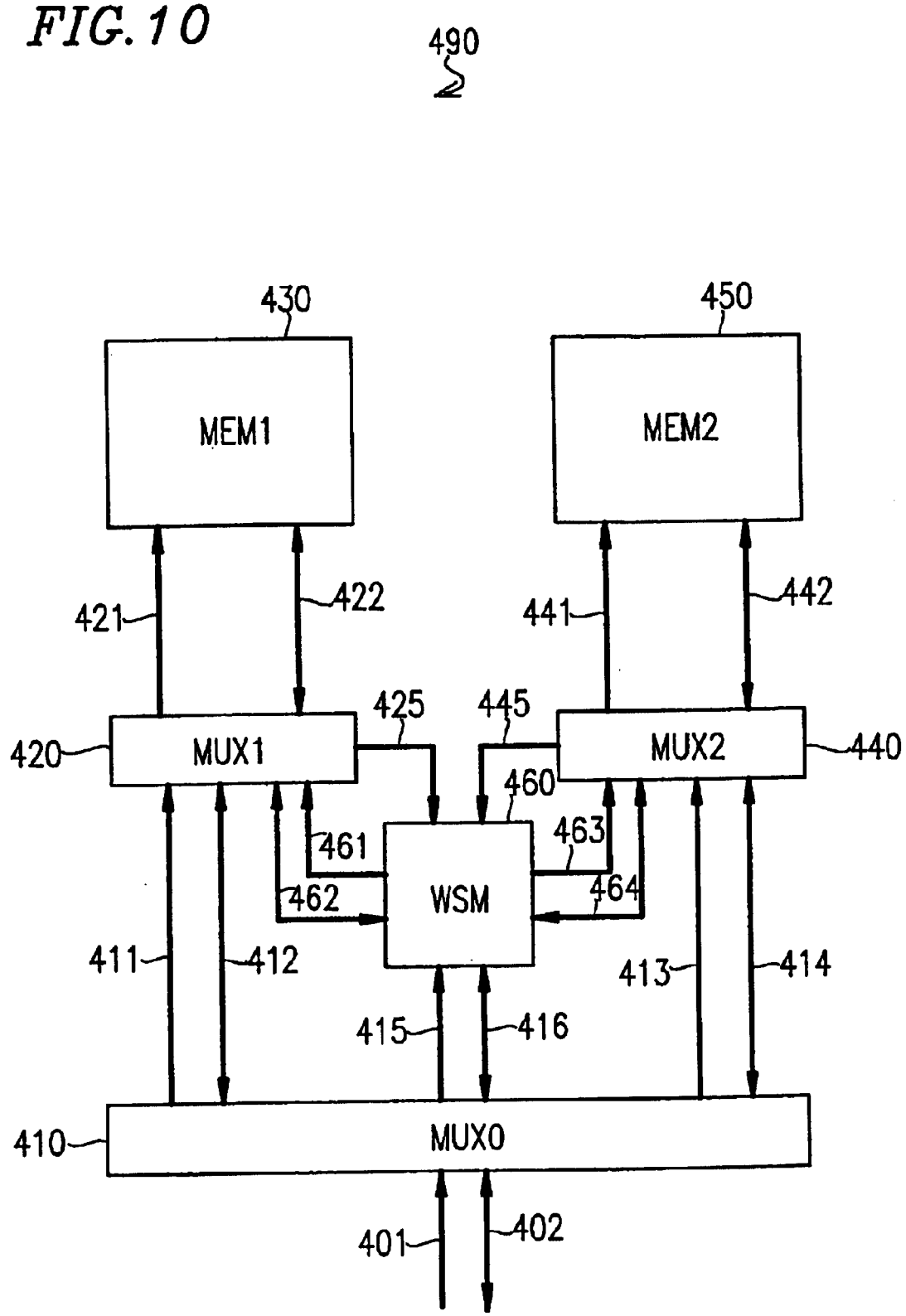
FIG. 10 is a block diagram of an exemplary configuration of a conventional semiconductor memory device, showing major parts thereof.

Furthermore, although semiconductor memory devices are described in Examples 1 to 3, the semiconductor memory device of the present invention can be easily incorporated into information apparatuses, such as portable telephone apparatuses, computers, and the like, in which the effects of the present invention can be obtained. For example, as shown in FIG. 9, when an information apparatus 100 comprises an information storage section, such as a RAM (e.g., an SRAM, a DRAM) or a ROM (e.g., a flash memory), an operating input section, a display section, such as a liquid crystal display apparatus, for displaying, for example, an initial screen or a result of information processing, and a CPU (central processing unit) for receiving a control command from the operating input section, carrying out various pieces of information processing while performing information read/write operations (memory operations) or data transfer operations in accordance with a predetermined information processing program or the data with respect to the information storage section, the semiconductor memory device of the present invention can be easily used as the information storage section (RAM or ROM).

For example, an effect of the semiconductor memory device of the present invention which is applied to a portable telephone apparatus will be described below. In this case, such a portable telephone apparatus is compared with a portable telephone apparatus having a flash memory and an SRAM, which employs a stacked package memory including a flash memory and an SRAM on a single package which, in recent times, has been often adopted, or a memory including an SRAM and a flash memory which is described in Japanese Patent Application No. 2000-176182 (herein incorporated by reference), qualitatively showing that the efficiency of memory access is improved.

In Japanese Patent Application No. 2000-176182, for example, a function of transferring data from an SRAM to a flash memory is provided, thereby making it possible to operate the SRAM during a data transfer operation.

The present invention improves convenience when the memory of Japanese Patent Application No. 2000-176182 is used in an actual system.

Recently, portable telephone apparatuses carry high-level functions, such as mailing, web browsing, executing of Java (trademark of Sun Microsystems, US), and the like.

In these applications, data saved temporarily in an SRAM is often transferred to a flash memory, for example, in saving a mail, caching in web browsing, downloading Java, or the like.

In the case of conventional stacked package memories, when such data stored in an SRAM is saved into a flash memory, a CPU reads the data stored in the SRAM and writes the read data to the flash memory. Such an operation is repeated until the entire data is saved.

The SRAM can be accessed while the flash memory is written. However, when the write operation is ended, an operation in which data to be saved is read out again from the SRAM, in order to perform a saving of data, and written to the flash memory, has to be repeated until the entire data is written to the flash memory. Therefore, in order to simultaneously perform saving of data and execution of another application, high-level task management is required, which leads to a reduction in performance.

If a memory capable of background transfer from the SRAM to the flash memory disclosed in Japanese Patent Application No. 2000-176182 is used, reading the SRAM and writing the flash memory need not be carried out one by one. In this case, if a transfer command is input to a memory, the SRAM can be thereafter accessed even during a data transfer operation while the data is being transferred from the SRAM to the flash memory.

For example, it is assumed that a Java application temporarily downloaded into an SRAM is saved into a flash memory while the Java application is executed.

Execution of a Java application requires a working RAM region. The SRAM in which the Java application is stored may be used as the RAM region, and is often accessed.

A data transfer operation causes the Java application stored in the SRAM to be transferred to the flash memory. At the same time, the Java application has to be read from the SRAM for the execution thereof. Further, an access to the working RAM is requested if execution of the Java application is required.

With the memory of the invention of Japanese Patent Application No. 2000-176182, such a simultaneous operation can be achieved, however, an operation for reading the SRAM for execution may affect a data transfer operation.

Specifically, since an external SRAM operation has priority, an internal SRAM read operation by a data transfer operation may be interrupted.

In the present invention, even when an internal SRAM read operation in a data transfer operation conflicts with an external SRAM memory operation, the probability that the time required for the data transfer operation is increased can be reduced.

Specifically, if the frequency that an SRAM read operation for saving data to a flash memory conflicts with an SRAM operation (memory operation) from outside the memory by another application is reduced, it is possible to inhibit an increase in the time required for the data transfer operation due to execution of the application.

In the above-described exemplary Java application, there is a possibility that saving of the Java application conflicts with a read operation or a working RAM operation for execution of the Java application. Therefore, there is a possibility that the time required for a data transfer operation is increased. However, the present invention reduces the frequency of such situations and relaxes a reduction in performance of a save operation in the Java application caused by the execution of the Java application.

Due to such a feature, in a memory using the present invention, as compared to conventional stacked package memories or the memory described in Japanese Patent Application No. 2000-176182, it is easier to execute a plurality of applications in which data is saved into a flash memory, or execute another application while data is saved into a flash memory.

As described above, according to the present invention, at least when a memory control section is provided which can access small memory regions separately or when a memory control section is provided which limits an access period to a minimum of that required for activation of a memory array in a memory section, the probability that an external memory operation and a data transfer operation, or external memory operations conflict can be reduced. Therefore, for example, a reduction in speed of a data transfer operation can be inhibited while priority is given to an external memory operation, or the probability that an external memory operation is interrupted can be reduced while priority is given to a data transfer operation.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
   first and second memory sections including a plurality of memory elements; and
   a memory control section for carrying out a data transfer operation between the first and second memory sections based on an external control command while carrying out a memory operation to at least one of the first and second memory sections,
   wherein at least one of the first and second memory sections include a plurality of small memory regions, and
   the memory control section allows each of the plurality of small memory regions to be separately and simultaneously subjected to an access operation.

2. A semiconductor memory device according to claim 1, wherein the memory control section controls to plurality of small memory regions so that one small memory region is used for a data transfer operation while another small memory region is used for a memory operation and/or one small memory region is used for a memory operation while another small memory region is also separately used for another memory operation, thereby simultaneously executing the data transfer operation and the memory operation and/or the memory operations.

3. A semiconductor memory device according to claim 2, wherein the first and second memory sections include different memory elements, and one of the first and second memory sections having a higher-write speed includes a plurality of small memory regions.

4. A semiconductor memory device according to claim 2, wherein the memory control section has an access operation section for limiting an access period for at least one of the first and second memory sections to a minimum of that required for each access operation, and a third memory section for storing predetermined memory data within the access period limited by the access operation section.

5. A semiconductor memory device according to claim 1, wherein the first and second memory sections include different memory elements, and one of the first and second memory sections having a higher-write speed includes a plurality of small memory regions.

6. A semiconductor memory device according to claim 3, wherein the memory control section has an access operation section for limiting an access period for at least one of the first and second memory sections to a minimum of that required for each access operation, and a third memory section for storing predetermined memory data within the access period limited by the access operation section.

7. A semiconductor memory device according to claim 1, wherein the memory control section has an access operation section for limiting an access period for at least one of the first and second memory sections to a minimum of that required for each access operation, and a third memory section for storing predetermined memory data within the access period limited by the access operation section.

8. A semiconductor memory device according to claim 7, further comprising
an access completion signal generation section for generating an access completion signal when an access is completed,
wherein the access operation receives the access completion signal and ends the access period started by an access permission signal.

9. A semiconductor memory device according to claim 7, wherein the memory control section has a third memory section for storing predetermined memory data within the access period limited by the access operation section, and the memory control section executes a data read operation within the access period limited by the access operation section when data is read from at least one of the first and second memory sections, end stores the read data to the third memory section.

10. A semiconductor memory device according to claim 9, wherein the memory elements included in the first and second memory sections are of different types, and
the memory control section reads data from one of the first and second memory sections having a higher-write speed.

11. A semiconductor memory device according to claim 7, wherein the memory control section writes data to at least one of the first and second memory sections within the access period limited by the access operation.

12. A semiconductor memory device according to claim 1, wherein the semiconductor memory device is integrated into a single semiconductor chip.

13. A semiconductor memory device, comprising:
first and second memory sections including a plurality of memory elements; and
a memory control section for carrying out a data transfer operation between the first and second memory sections based on an external control command while carrying out a memory operation to at learnt one of the first and second memory sections,
wherein the memory control section has an access operation section for limiting an access period for at least one of the first and second memory sections to a minimum of that required for each access operation.

14. A semiconductor memory device according to claim 13, further comprising
an access completion signal generation section for generating an access completion signal when an access is completed,
wherein the access operation receives the access completion signal and ends the access period started by an access permission signal.

15. A semiconductor memory device according to claim 13, wherein the memory control section has a third memory section for storing predetermined memory data within the access period limited by the access operation section, and the memory control section executes a data read operation within the access period limited by the access operation section when data is read from at least one of the first and second memory sections, and stores the read data to the third memory section.

16. A semiconductor memory device according to claim 15, wherein the memory elements included in the first and second memory sections are of different types, and
the memory control section reads data from one of the first and second memory sections having a higher-write speed.

17. A semiconductor memory device according to claim 13, wherein the memory control section writes data to at least one of the first and second memory sections within the access period limited by the access operation.

18. A semiconductor memory device according to claim 13, wherein the semiconductor memory device is integrated into a single semiconductor chip.

19. An information apparatus, wherein a semiconductor memory device according to claim 1 is used to execute at least one of a data transfer operation and a memory operation, or at least two memory operations within an access period.

20. A method for determining an access period for a semiconductor memory device according to claim 1, wherein when an access is completed, an access completion signal is generated, and when the access completion signal is received, the access period started by an access permission signal is ended.

21. A method for determining an access period for a semiconductor memory device according to claim 13, wherein when an access is completed, an access completion signal is generated, and when the access completion signal is received, the access period started by an access permission signal is ended.

* * * * *